(12) United States Patent
Pendharkar et al.

(10) Patent No.: US 6,225,673 B1
(45) Date of Patent: May 1, 2001

(54) INTEGRATED CIRCUIT WHICH MINIMIZES PARASITIC ACTION IN A SWITCHING TRANSISTOR PAIR

(75) Inventors: Sameer P. Pendharkar, Plano; Taylor R. Efland, Richardson, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/257,307

(22) Filed: Feb. 25, 1999

Related U.S. Application Data
(60) Provisional application No. 60/076,683, filed on Mar. 3, 1998.

(51) Int. Cl.[7] .................................................. H01L 29/00
(52) U.S. Cl. .......................... 257/502; 257/500; 257/544
(58) Field of Search ........................................ 257/491, 492, 257/547, 549, 343, 502, 409, 500, 544, 337

(56) References Cited

U.S. PATENT DOCUMENTS

| | | | |
|---|---|---|---|
| 5,159,427 | * 10/1992 | Ogura | 357/48 |
| 5,286,995 | * 2/1994 | Malhi | 257/549 |
| 5,578,862 | * 11/1996 | Fujii et al. | 257/547 |
| 5,661,430 | * 8/1997 | Palara et al. | 257/547 |
| 5,703,390 | * 12/1997 | Itoh | 257/337 |
| 5,811,850 | * 9/1998 | Smayling et al. | 257/335 |
| 5,852,314 | * 12/1998 | Depetio et al. | 257/492 |
| 6,118,152 | * 9/2000 | Yamaguchi | 257/347 |

* cited by examiner

Primary Examiner—Olik Chaudhuri
Assistant Examiner—Nathan W. Ha
(74) Attorney, Agent, or Firm—Jacqueline J. Garner; W. James Brady, III; Frederick J. Telecky, Jr.

(57) ABSTRACT

An integrated circuit (13) includes a P-epi substrate (51) having first and second n+ isolation layers (53, 54) buried therein, the first and second isolation layers being respectively coupled to ground and to a supply voltage (VCC). A contact region (52) of the substrate is closely adjacent a first isolation layer, is spaced from the second isolation layer, and is coupled to ground. First and second P-epi portions (57, 58) of the substrate are disposed within the first and second isolation layers. The first portion includes an n+ source region (62) disposed in a p-well (61) which is closely adjacent the first isolation layer in the vicinity of the contact region, and includes an n+ drain region (68). The second portion includes an n+ source region (77) coupled to the drain region in the first portion, and an n+ drain region (82) coupled to the supply voltage.

11 Claims, 2 Drawing Sheets

INTEGRATED CIRCUIT WHICH MINIMIZES PARASITIC ACTION IN A SWITCHING TRANSISTOR PAIR

This application claims priority under 35 U.S.C. § 119 (e) (1) of provisional application No. 60/076,683, filed Mar. 3, 1998.

TECHNICAL FIELD OF THE INVENTION

This invention relates in general to an integrated circuit that implements a switching transistor pair having associated parasitic devices and, more particularly, to such an integrated circuit which minimizes power consumption in the parasitic devices while reducing the die area required for implementation.

BACKGROUND OF THE INVENTION

Switching arrangements for driving a load frequently include at least one pair of switching transistors, which are field effect transistors coupled in series between a supply voltage and ground. For example, one such switching arrangement includes a first pair of field effect switching transistors coupled in series between a supply voltage and ground, and includes a second pair of field effect switching transistors also coupled in series between the supply voltage and ground. A load has a first end coupled to the node between the transistors of the first pair, and a second end coupled to the node between the transistors of the second pair. This exemplary arrangement of two transistor pairs and a load is commonly known as an H-bridge configuration. When a switching transistor pair of this type is implemented in an integrated circuit, the structure of the implementation can inherently create unwanted parasitic circuit devices, such as diodes and/or transistors.

For example, one integrated circuit for implementing a switching transistor pair includes a P-epi substrate having first and second n+ isolation layers buried therein. First and second portions of the P-epi substrate are disposed within the first and second isolation layers. The first and second portions each have therein a p-well containing a source region, and an n-type drain region spaced from the p-well. The drain region in the second portion is coupled to a supply voltage, the source region in the second portion is coupled to the drain region in the first portion, and the source region in the first portion is coupled to ground. The substrate is coupled to ground at a contact region external to both isolation regions, and the isolation regions are both coupled to the supply voltage. The source and drain regions for the first portion must both be spaced from the isolation region for the first portion, in order to avoid breakdown.

In this integrated circuit, the drain region in the first portion, the first portion itself and the first isolation layer together act as an NPN bipolar junction transistor. Since the collector (first isolation layer) is coupled to a supply voltage, and since the base is lightly doped (P-epi), when the base-emitter junction of this parasitic NPN transistor is forward biased, there will be a high gain and a substantial amount of current flow in the collector, causing the parasitic transistor to dissipate substantial power. Since the parasitic transistor is unnecessary to the operation of the switching transistor pair, its power dissipation represents undesirable inefficiency.

A further consideration results from the fact that the first isolation layer is coupled to the supply voltage, whereas the source region of the first portion and a contact region of the substrate are both coupled to ground. In order to avoid breakdown, the source region of the first portion and the contact region of the substrate must both be spaced adequately from the first isolation layer. Due in part to this requirement, the die area required to implement the switching transistor pair in the integrated circuit is larger than desirable. In view of the fact that cost is an important factor in the manufacture and sale of integrated circuits, and the fact that cost is related to die area, reducing the die area is advantageous.

SUMMARY OF THE INVENTION

From the foregoing, it may be appreciated that a need has arisen for an integrated circuit implementation of a switching transistor pair, which reduces the power consumption in parasitic devices associated with the transistor pair, and which reduces the die area required to implement the switching transistor pair. According to the present invention, an integrated circuit is provided to address this need, and includes: first and second transistors which are field effect switching transistors and which are coupled in series between a supply voltage and ground; a third transistor which is a parasitic PNP bipolar junction transistor, which has an emitter coupled to a node between the first and second transistors, which has a collector coupled to ground, and which has a base coupled to the supply voltage; and a fourth transistor which is a parasitic NPN bipolar junction transistor, which has an emitter coupled to the node, which has a collector coupled to ground, and which has a base coupled to ground.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
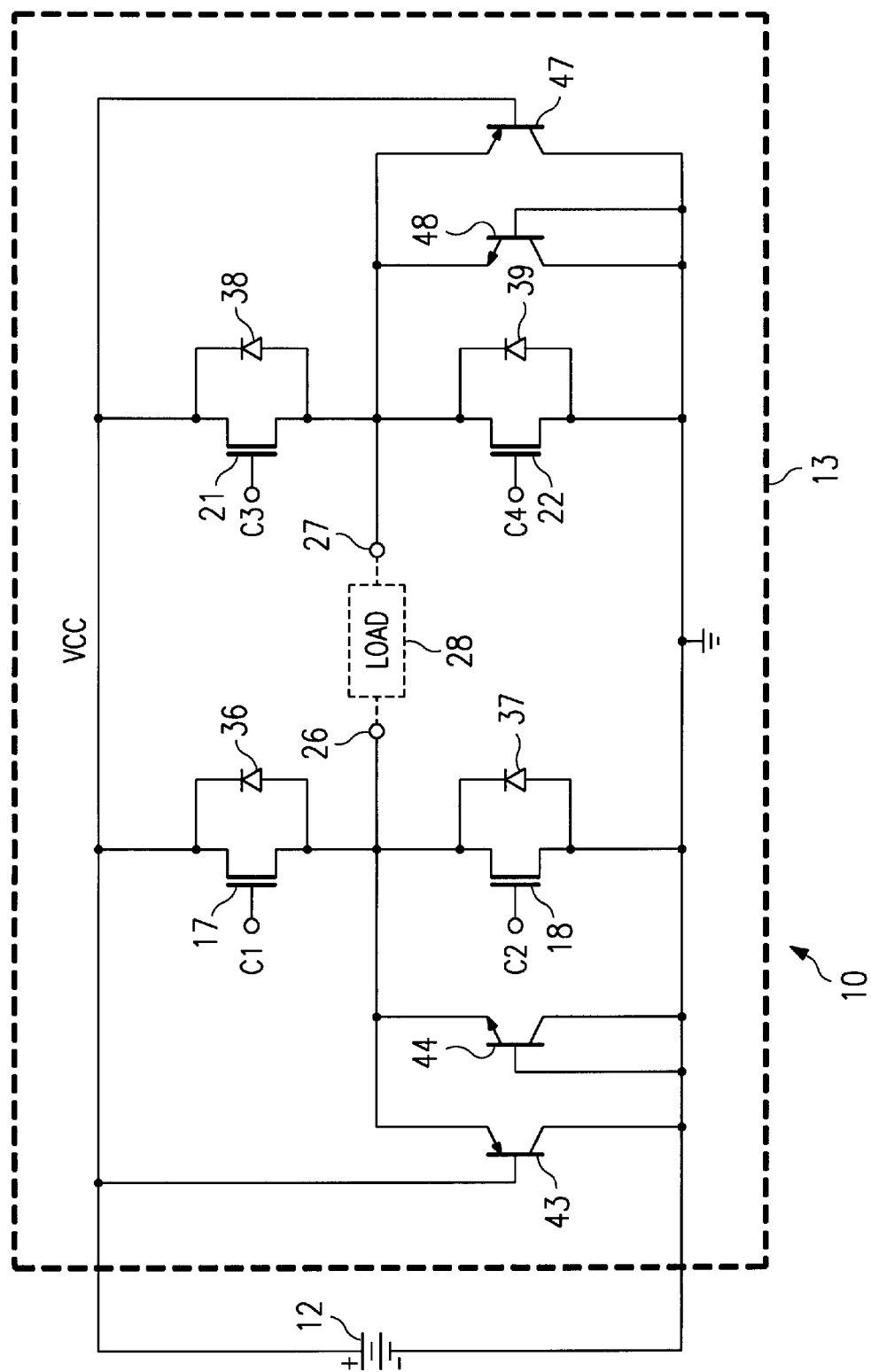
FIG. 1 is a schematic diagram of a circuit apparatus embodying the present invention, including a power source and an integrated circuit.

FIG. 1 is a schematic diagram of a circuit apparatus 10 which embodies the present invention. The circuit apparatus 10 includes a power source 12, and an integrated circuit 13. The power source 12 is a DC voltage source, such as a battery, and produces a DC voltage VCC which is supplied to the integrated circuit 13. The integrated circuit 13 may include circuitry in addition to that shown in FIG. 1. FIG. 1 depicts just a portion of the circuitry, which is needed to facilitate an understanding of the present invention.

In more detail, the integrated circuit 13 includes two field effect switching transistors 17 and 18, which are coupled in series between the supply voltage VCC and ground. The transistor 17 has its drain coupled to VCC. The transistor 18 has its drain coupled to the source of transistor 17, and its source coupled to ground. In a similar manner, two additional field effect switching transistors 21 and 22 are coupled between VCC and ground, the transistor 21 having its drain coupled to VCC, and the transistor 22 having its source coupled to ground and its drain coupled to the source of transistor 21. The upper transistor 17 or 21 of each pair is sometimes referred to as a high side driver, and the lower transistor 18 or 22 of each pair is sometimes referred to as a low side driver.

The node between the transistors 17 and 18 is coupled to a terminal 26, and the node between transistors 21 and 22 is coupled to a terminal 27. A load 28 may be coupled between the terminals 26 and 27. The load 28 is typically not a part of the integrated circuit 13, but is external to the integrated circuit 13. The load 28 may be the coil of an actuator, such as a voice coil motor.

Respective control signals C1 through C4 are applied to the gates of the transistors 17–18 and 21–22. The control signals C1–C4 originate from a not-illustrated circuit which may be either internal or external to the integrated circuit 13. The control signals C1 through C4 are generated in a manner so that the transistors 17 and 22 can be simultaneously turned on while the transistors 18 and 21 remain off, and so that the transistors 18 and 21 can be simultaneously turned on while the transistors 17 and 22 remain off.

When the transistors 17 and 22 are both actuated, current flows through the transistor 17, the load 28, and the transistor 22. When the transistors 21 and 18 are both actuated, current flows through the transistor 21, the load 28 and the transistor 18. Thus, current flows through the load 28 in one direction when transistors 17 and 22 are actuated, and flows through the load 28 in the opposite direction when the transistors 21 and 18 are actuated. The load 28, the transistors 17–18, and the transistors 21–22 in FIG. 1 have the shape of the letter "H", and this configuration is therefore referred to as an H-bridge.

The transistors 17–18 and 21–22 of the H-bridge form the primary components of the illustrated circuitry from the integrated circuit 13. However, when the integrated circuit 13 is fabricated, for example using a RESURF DMOS process, other secondary or parasitic devices are incidentally formed in a manner described in more detail later. In the disclosed embodiment, the secondary devices include four diodes 36–39, which each have an anode and cathode respectively coupled to the source and drain of a respective one of the transistors 17–18 and 21–22.

The parasitic devices also include four transistors 43–44 and 47–48. The transistor 43 is a PNP bipolar junction transistor having an emitter coupled to the node between transistors 17 and 18, a base coupled to the supply voltage VCC, and a collector coupled to ground. The transistor 44 is an NPN bipolar junction transistor having an emitter coupled to the node between transistors 17 and 18, and having a base and collector coupled to ground. The transistor 47 is a PNP bipolar junction transistor having an emitter coupled to the node between transistors 21 and 22, having a base coupled to the supply voltage VCC, and having a collector coupled to ground. The transistor 48 is an NPN bipolar junction transistor having an emitter coupled to the node between transistors 21 and 22, and having a base and collector coupled to ground.

Figure 2:
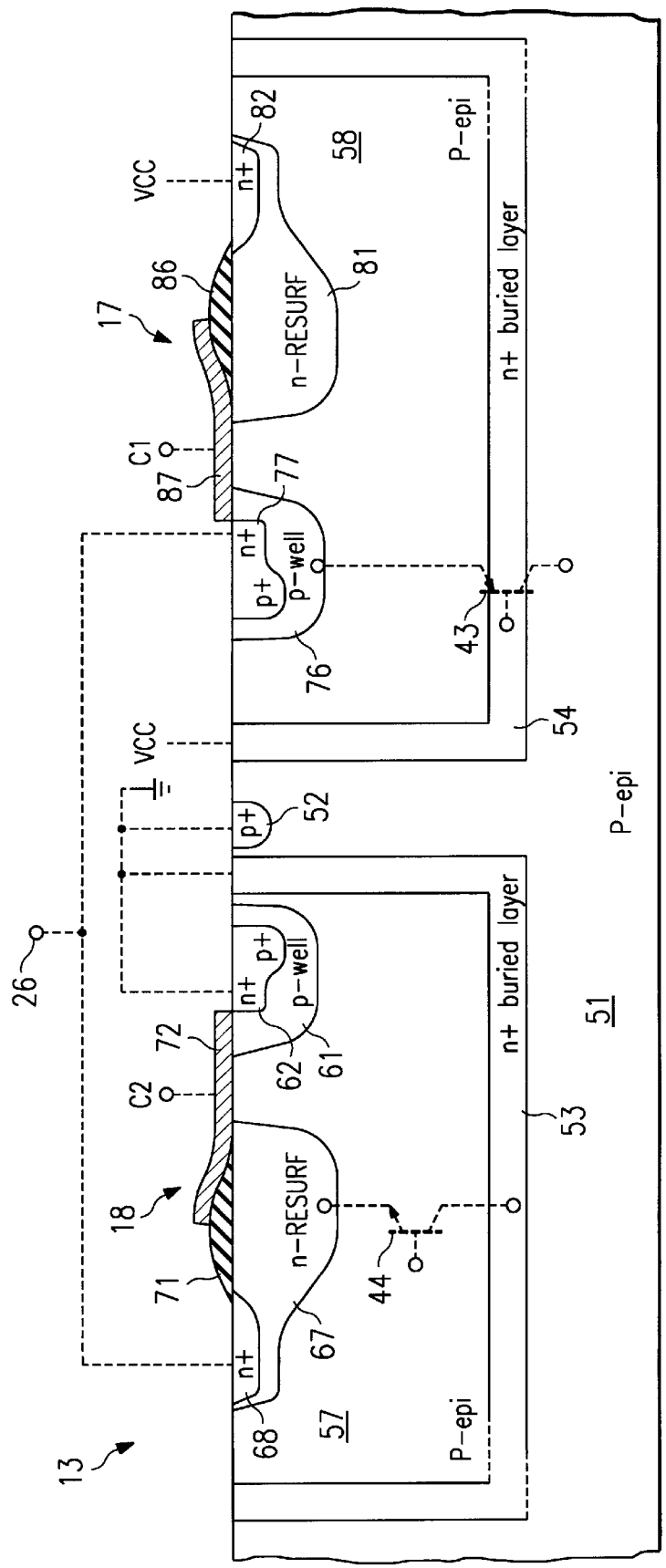
FIG. 2 is a diagrammatic sectional side view of a portion of the integrated circuit of FIG. 1.

FIG. 2 is a diagrammatic sectional side view of a portion of the integrated circuit 13. A P-epi semiconductor substrate 51 has a p+ contact region 52 disposed adjacent an upper surface thereof. Two n+ buried isolation layers 53 and 54 are provided within the substrate 51, with the p+ region 52 therebetween. Respective P-epi portions 57 and 58 of the P-epi substrate 51 are provided within the respective isolation layers 53 and 54. The substrate portions 57 and 58 each have thereon a part of the upper surface of the substrate 51. The region 52 is closely adjacent the nearest portion of the isolation layer 53, but is spaced somewhat from the nearest portion of the isolation layer 54, for reasons discussed later.

The P-epi portion 57 has therein a p-well 61, which is closely adjacent the portion of the isolation layer 53 nearest the p+ contact region 52. The p-well 61 has therein a source region 62, which includes p+ and n+ portions. The P-epi portion 57 also has therein, at a location spaced from the p-well 61, and on the side of the p-well 61 remote from the p+ contact region 52, an n-RESURF region 67. The n-RESURF region 67 has therein an n+ drain region 68, which is adjacent the top surface of substrate 51, and which is near an end of region 67 remote from the p-well 61 and the p+ contact region 52. A silicon dioxide layer 71 is provided on the n-RESURF region 67. A gate electrode 72 engages the top surface of the substrate 51 between the p-well 61 and the n-RESURF region 67, and has a portion disposed on top of the silicon dioxide layer 71.

The P-epi portion 58 has therein a p-well region 76, which is spaced somewhat from the portion of the isolation layer 54 nearest the p+ contact region 52. The p-well region 76 has therein a source region 77, which is adjacent the top surface of substrate 51 and which includes p+ and n+ portions. The P-epi portion 58 also includes an n-RESURF region 81, which is disposed on the side of the p-well region 76 remote from the p+ contact region 52, and which is spaced from the p-well region 76. The n-RESURF region 81 has therein an n+ drain region 82, the n+ region 82 being adjacent the top surface of the substrate 51, and being provided near an end of the n-RESURF region 81 which is remote from the p-well 76 and the p+ contact region 52.

A silicon dioxide layer 86 is provided on the n-RESURF region 81. A gate electrode 87 engages the top surface of the substrate 51 between the p-well 76 and the n-RESURF region 81, and has a portion disposed on top of the silicon dioxide layer 86. The n+ drain region 82, the gate electrode 87, and the source region 77 are respectively the drain, gate and source of the transistor 17 of FIG. 1. The n+ drain region 68, the gate 72, and the source region 62 are respectively the drain, gate and source of the transistor 18 of FIG. 1. Thus, the integrated circuit 13 in the disclosed embodiment is a RESURF DMOS device in which the drains are isolated from the isolation layers.

The operational connections between the transistors 17 and 18 are shown in broken lines in FIG. 2, reflecting that the source of the transistor 17 is coupled to the drain of the transistor 18 and to the terminal 26, that the drain of transistor 17 is coupled to the supply voltage VCC, that the source of transistor 18 is coupled to ground, and that the gates of transistors 17 and 18 are respectively coupled to the signals C1 and C2. As also shown in broken lines, the n+ isolation layer 54 is coupled to VCC, the n+ isolation layer 53 is coupled to ground, and the p+ contact region 52 is coupled to ground.

If the isolation layers 53 and 54 were not present, the source regions 62 and 77 would be effectively shorted together by the continuous p-type material between them, including the P-epi substrate 51 and the p-wells 61 and 76. The isolation layers 53 and 54 are therefore necessary in order for the integrated circuit of FIG. 2 to work. However, providing the isolation layers 53 and 54 inherently creates the parasitic transistors 43 and 44, which for clarity are shown symbolically in broken lines in FIG. 2.

More specifically, a PNP junction is defined by the p-well 76 and P-epi portion 58, the n+ isolation layer 54, and the P-epi substrate 51. This PNP junction serves as the unwanted parasitic transistor 43. Similarly, an NPN junction is defined by the n-RESURF region 67, the P-epi portion 57, and the n+ isolation layer 53, and serves as the unwanted parasitic transistor 44. The symbolic transistor 43 is shown with its emitter terminal in the p-well region 76, its base terminal in the n+ isolation layer 54, and its collector in the substrate 51. The symbolic transistor 44 is shown with its emitter terminal in the n-RESURF region 67, its base in the P-epi portion 57, and its collector in the n+ isolation layer 53. The parasitic diode 37 results from the PN junction defined by portion 57 and region 67, and parasitic diode 36 results from the PN junction defined by portion 58 and region 81.

The present invention provides numerous technical advantages. One such technical advantage is that the isolation layer for the low side driver is coupled to ground rather than a supply voltage. Since this isolation layer defines the collector of the associated parasitic transistor, the collector of the transistor is coupled to ground. As a result, the parasitic transistor does not operate in its active region, even if the base-emitter junction is forward biased. Thus, this parasitic transistor has a lower gain and a lower power consumption than if the collector were coupled to a supply voltage. A related advantage is that, since the isolation layer is coupled to ground rather than to a supply voltage, it does not need to be spaced a significant distance from the contact region at which the substrate is grounded, and in fact can be provided closely adjacent this contact region. This reduces the die area required to implement a low side and high side driver transistor pair, which in turn reduces the cost of the resulting integrated circuit.

Still another technical advantage results from laying out the low side driver transistor so that its source region is closer than its drain region to the associated high side driver transistor. Since the source region and the isolation layer for the low side driver transistor are both coupled to ground, it is not necessary to provide a significant space between them in order to avoid breakdown, and in fact they can be positioned relatively close to each other. This further reduces the die area required to implement the structure of FIG. 2, which in turn effects a cost reduction.

Although one embodiment has been illustrated and described in detail, it should be understood that various changes, substitutions and alterations can be made therein without departing from the scope of the present invention. For example, the disclosed embodiment shows a low side driver and a high side driver which are each implemented by a single transistor, but it will be recognized that each can be implemented in a form of a plurality of transistors which are coupled entirely in parallel with each other. Further, the disclosed embodiment happens to be an H-bridge driver arrangement having two pairs of series-coupled switching transistors, but it will be recognized that the invention can be implemented in other circuit arrangements which have at least one pair of series-coupled switching transistors. In addition, the disclosed embodiment includes n-RESURF regions, but it will be recognized that the n-RESURF regions could alternatively be some other n-type implant.

It should also be recognized that direct connections disclosed herein could be altered, such that two disclosed components or elements are coupled to one another through an intermediate device or devices without being directly connected, while still realizing the present invention. Other changes, substitutions and alterations are also possible without departing from the spirit and scope of the present invention, as defined by the following claims.

What is claimed is:

1. An integrated circuit, comprising:
   first and second transistors which are field effect switching transistors and which are coupled in series between a supply voltage and ground;
   a third transistor which is a parasitic PNP bipolar junction transistor, which has an emitter coupled to a node between said first and second transistors, which has a collector coupled to ground, and which has a base coupled to the supply voltage;
   a fourth transistor which is a parasitic NPN bipolar junction transistor, which has an emitter coupled to said node, which has a collector coupled to ground, and which has a base coupled to ground;
   a p-type semiconductor substrate;
   first and second n-type isolation layers buried in said substrate, said first and second isolation layers having first and second portions of said p-type substrate respectively disposed therein; and
   first and second spaced n-type regions disposed in each of said first and second portions, said first and second n-type regions in said first portion respectively being a source and a drain of said first transistor, and said first and second n-type regions in said second portion respectively being a source and a drain of said second transistor;
   said first isolation layer being coupled to ground, said second isolation layer being coupled to the supply voltage, and said semiconductor substrate being coupled to ground at a location external to said first and second isolation layers;
   wherein said location at which said substrate is coupled to ground is disposed between said first and second isolation layers, is closely adjacent said first isolation layer, and is spaced from said second isolation layer; and
   wherein said first portion includes a p-well having therein said first n-type region of said first portion, said p-well being closer than said second n-type region of said first portion to said first isolation layer, and being disposed closely adjacent said first isolation layer.

2. An integrated circuit according to claim 1, wherein said first transistor has a drain coupled to the supply voltage, and has a source; and
   wherein said second transistor has a drain coupled to said source of said first transistor, and has a source coupled to ground.

3. An integrated circuit according to claim 1, including fifth and sixth transistors which are field effect switching transistors and which are coupled in series between the supply voltage and ground;
   a seventh transistor which is a parasitic PNP bipolar junction transistor, which has an emitter coupled to a node between said fifth and sixth transistors, which has a collector coupled to ground, and which has a base coupled to the supply voltage;
   an eighth transistor which is a parasitic NPN bipolar junction transistor, which has an emitter coupled to said node between said fifth and sixth transistors, which has a collector coupled to ground, and which has a base coupled to ground; and
   a load having a first end coupled to said node between said first and second transistors, and having a second end coupled to said node between said fifth and sixth transistors.

4. An integrated circuit according to claim 1, including a first parasitic diode having a cathode coupled to the supply voltage and an anode coupled to said node; and
   a second parasitic diode having a cathode coupled to said node and an anode coupled to ground.

5. An integrated circuit, comprising:
   a p-type semiconductor substrate;

first and second isolation regions which are made of an n-type material and which are buried in said substrate;

first and second portions of said p-type semiconductor substrate which are respectively disposed within said first and second isolation regions, and which are electrically isolated from each other by said isolation regions;

first and second n-type regions which are respectively disposed within said first and second portions of said substrate;

first and second p-well regions which are respectively disposed within said first and second portions of said substrate, and which are spaced from said first and second n-type regions, respectively;

first and second source regions which are respectively disposed within said first and second p-well regions; and first and second gate electrodes, said first gate electrode being electrically coupled to said first portion of said substrate at a location between said first n-type region and said first p-well region, and said second gate electrode being electrically coupled to said second portion of said substrate at a location between said second n-type region and said second p-well region;

said first source region and said first isolation region each being coupled to ground, said first n-type region being coupled to said second source region, said second n-type region and said second isolation region each being coupled to a supply voltage, and said substrate being coupled to ground at a location external to said first and second isolation regions.

6. An integrated circuit according to claim 5, including two oxide layers respectively provided on said first and second n-type regions, a portion of each said gate electrode being disposed on a respective one of said oxide layers.

7. An integrated circuit according to claim 5, wherein said substrate and said first and second portions thereof are made of a P-epi material, and wherein said first and second n-type regions each include an n-RESURF region.

8. An integrated circuit according to claim 7, wherein said source regions each include a p+ region and an n+ region.

9. An integrated circuit according to claim 5, wherein said first source region is closer than said first n-type region to said first isolation region and said second portion, and is closely adjacent said first isolation region.

10. An integrated circuit according to claim 5,
wherein said first and second isolation regions are spaced from each other; and
wherein said location at which said substrate is coupled to ground is disposed between said first and second isolation regions, is closely adjacent said first isolation region, and is spaced from said second isolation region.

11. An integrated circuit according to claim 10, wherein said substrate includes a region of p+ material at said location where said substrate is coupled to ground.

* * * * *